United States Patent [19]

Cox

[11] 4,187,461

[45] Feb. 5, 1980

[54] DYNAMIC THRESHOLD IMPULSE DIRECTIVITY INDICATOR

[75] Inventor: Philip P. Cox, Piscataway, N.J.

[73] Assignee: Dranetz Engineering Laboratories, Inc., South Plainfield, N.J.

[21] Appl. No.: 879,234

[22] Filed: Feb. 21, 1978

[51] Int. Cl.² ................... G01R 19/00; G01R 31/08
[52] U.S. Cl. ........................... 324/102; 324/52; 324/103 P; 324/111
[58] Field of Search ............... 324/102, 103 P, 103 R, 324/52, 133, 112, 111

[56] References Cited

U.S. PATENT DOCUMENTS

| | | | |
|---|---|---|---|
| 3,571,705 | 3/1971 | Crane et al. | 324/77 R |
| 3,636,445 | 1/1972 | Douaity et al. | 324/77 R |
| 3,662,380 | 5/1972 | Cargile | 324/112 |
| 3,753,089 | 8/1973 | Gunn et al. | 324/133 |
| 3,774,109 | 11/1973 | Janycky | 324/103 P |
| 3,794,915 | 2/1974 | Wolfinger | 324/111 |
| 3,808,529 | 4/1974 | Rowlands | 324/77 P |
| 3,816,815 | 6/1974 | Schumann | 324/112 |
| 3,838,339 | 9/1974 | Brandt | 324/133 |
| 3,986,115 | 10/1976 | Huang | 324/102 |
| 3,986,116 | 10/1976 | Smith et al. | 324/102 |
| 3,987,393 | 10/1976 | Knauer | 324/102 |
| 4,006,413 | 1/1977 | Silberberg | 324/103 P |

OTHER PUBLICATIONS

Huang, K.T.; "Power Line Transient Source..."; Dept. of Defence Report No. TN-1327; Feb. 1974; pp. 1–18.

Primary Examiner—Rudolph V. Rolinec
Assistant Examiner—Ernest F. Karlsen

[57] ABSTRACT

A circuit for ascertaining the direction of origin of the most significant transient appearing on a electrical power line within a predetermined interval is disclosed. Threshhold comparator circuit (325, 326) are provided to insure that transient polarities needed for the directivity determination are ascertained while the transient impulse is still rising towards its peak value. For any nominal, user-set threshhold ($V_2$), a lower preliminary threshold ($V_1$) is automatically set and when the transient exceeds the preliminary threshhold, the transient polarities are determined and correlated to effect a tentative directivity determination which is stored in an input latch (205). When the transient exceeds the nominal threshhold, the directivity determination is transferred to an output latch (211) to be read by an output printing device. If a larger transient occurs before the directivity of a previous transient has been read by the output printing device, directivity data for the larger transient is substituted in the latches (205, 211). A dynamic feedback mechanisms (C+, 122, R61, VPO, R30, R23) increases the effective threshholds for the comparator circuits (326, 325) in accordance with the peak value of the largest transient occurring during the predetermined interval.

11 Claims, 7 Drawing Figures

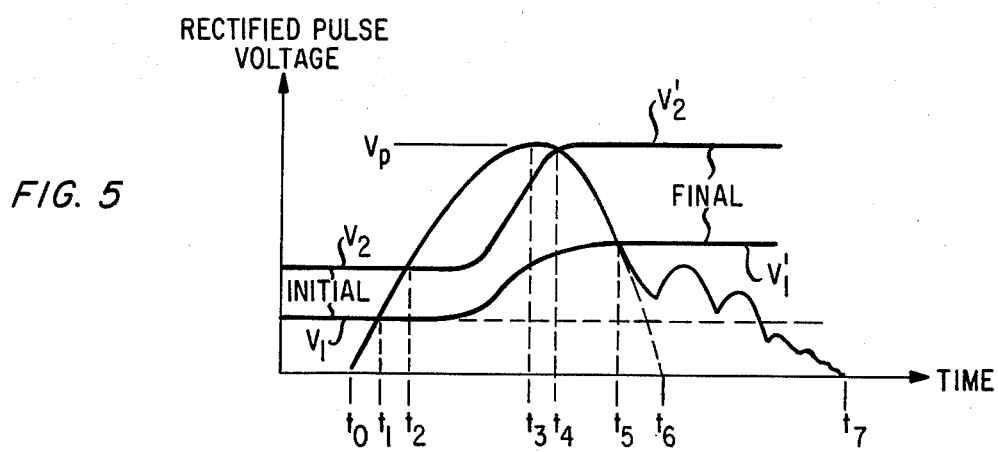
FIG. 5
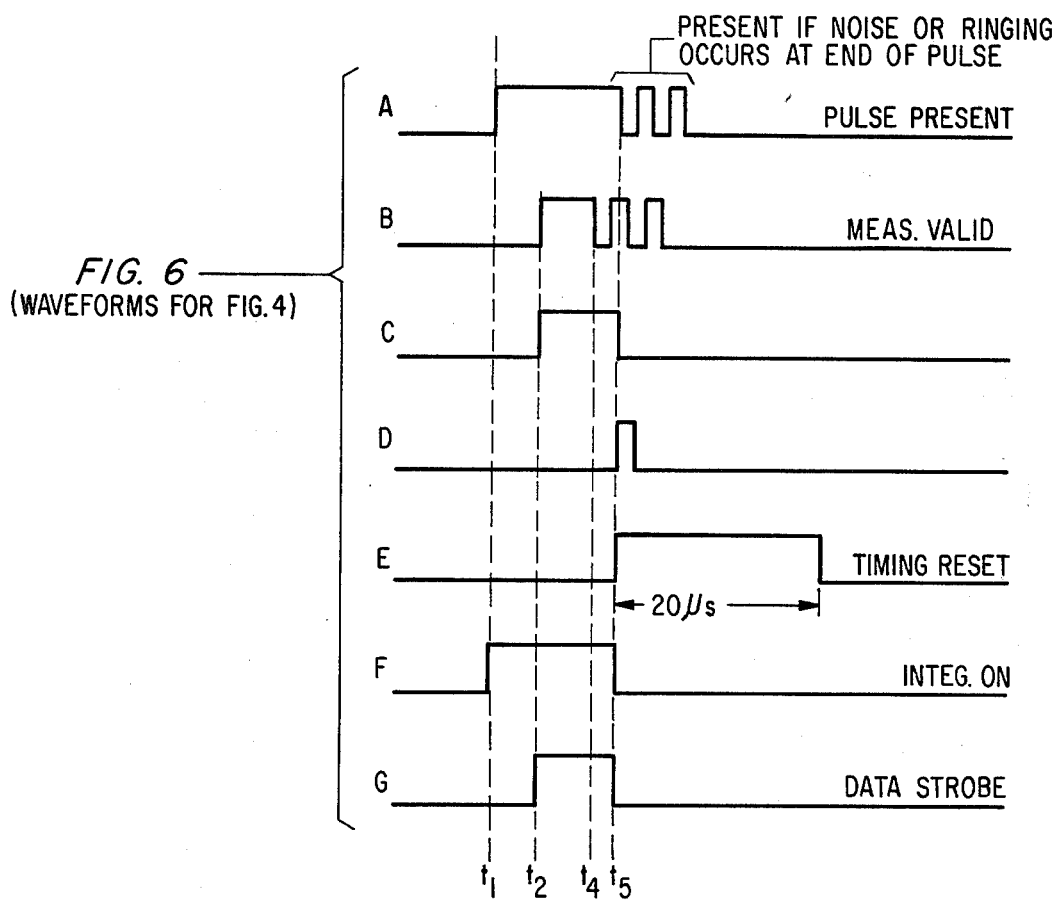
FIG. 6
(WAVEFORMS FOR FIG. 4)
FIG. 7

DYNAMIC THRESHOLD IMPULSE DIRECTIVITY INDICATOR

BACKGROUND OF THE INVENTION

This invention relates to arrangements for ascertaining the directivity of transient disturbances appearing on power lines and, more particularly, to arrangements for recording data concerning the appearance of the more significant disturbances and ignoring disturbances of lesser magnitude or energy content.

Heretofore, it has been known, as for example, from the study of K. T. Huang reported in Department of Defense Report No. TN-1327 entitled "Power Line Transient Source and Direction of Propagation Detector" published in February 1974 that the direction of the location of the source of a transient signal creating a disturbance on an electrical power system can be ascertained by determining the polarity of the transient current and voltage. This relationship holds true provided that the respective polarities are determined within a short time of the occurrence of the transient. It was Huang's hypothesis that at the moment when the distance occurs the transient current and voltage are in phase and that if a sensor can pick up information on the polarity of the transient voltage and the direction of transient current at that critical moment, the direction of the transient along the lines of the power system can be determined. The source of the transient could then be located by tracing along the power line in the ascertained direction. Instruments have for some time been commercially available that attempt to indicate the direction of transient disturbances. Experience with such equipment has, however, not been wholly satisfactory, it sometimes not being possible to indicate the direction of a transient's source and at other times, it has been suspected that the wrong direction has been indicated.

Equipment for reliably indicating other parameters of line voltage disturbances has, however, heretofore been made widely available. For example, it has for some time been practical to monitor 60 Hz mains and to record the time of occurrence and the peak value of a transient impulse, the number of cycles of the mains frequency during which a line voltage sag or surge persisted, and the slow-averaged RMS level of the line voltage. Instruments are available which have the ability to store data concerning a limited number of transients that may occur while the outprinting equipment is operating, and when the capacity of this temporary memory is exceeded, to printout a summary count of the number of excess transients and of the highest amplitude reached by any of the excess transient disturbances. The Dranetz Engineering Laboratories' Model 606 "Power-Line Disturbance Analyzer" is an example of such presently available equipment.

While it would be of obvious advantage to combine the features of the foregoingly described two types of equipment, the combination is not warranted unless the reliability of the direction-indicating technique can be improved.

SUMMARY OF THE INVENTION

I have discovered that, in a system having linear passive loads transient direction may be reliably determined if the impulse voltage and current polarities are sensed before the first slope polarity reversal of the impulse voltage waveform. For example, when a transient impulse appears on a capacitively loaded power line, the transient current impulse is the time-derivative of the transient voltage impulse and thus reverses its direction immediately after the voltage impulse passes its peak value and starts to decrease in amplitude. Therefore, the ascertainment of transient impulse voltage and current polarities will give the correct directivity result provided that these polarities are ascertained while that impulse is still rising towards its peak value. In the illustrative embodiment of the invention this is accomplished by an arrangement which automatically establishes a "preliminary threshhold" whenever the instrument user selects a nominal threshhold for the level of transient to be monitored. This preliminary threshhold is advantageously approximately half the value of the nominal or externally-specified threshhold. When a transient voltage impulse exceeds this preliminary threshold, logic circuitry is activated but the stored data is not permitted to be delivered to the recording and printing apparatus until the transient exceeds the nominal threshhold. The nominal threshhold is thus employed as a validating threshhold to control the delivery of data that is already in process of being monitored rather than as a level to initiate circuit response.

It is another aspect of the operation of an illustrative embodiment of the invention to guard against measurement errors that may be introduced by transient impulses having a duration that exceeds the low frequency response of the measuring equipment. A limit to the low frequency response of impulse monitoring equipment arises because of the need to distinguish an impulse from the periodic alterations characterizing the mains frequency. However, for impulses having a duration which is a significant percentage of the period of the mains, the leading and trailing edges of the disturbance may be detected as two separate signals or as a signal with an erroneously enhanced magnitude of incorrect polarity. In the illustrative embodiment the effects of such wide pulses are mitigated by a circuit which detects the appearance of a wide pulse and inhibits the delivery of transient direction and polarity data for an interval sufficient to block passage of possible incorrect polarity or direction data caused by the wide pulse.

It is a further aspect of the operation of an illustrative embodiment of the invention that if a larger transient appears after a previous transient of valid amplitude, but before this transient has been recorded, data on the subsequent and larger transient rather than the earlier transient will be delivered to the recording and printing apparatus. This assures that the printed record will show the most significant, i.e., largest amplitude, transient that occurred during any given monitoring interval. The monitoring interval used in the illustrative embodiment is 33.3 milliseconds when the monitored line frequency is 60 Hz since the outputs are read once during each two cycles of power line frequency.

The foregoing and other objects of the invention are obtained in one illustrative embodiment in which the transient voltage amplitude is compared with the preliminary and nominal threshhold level voltages and also with the peak voltage value of any priorly occurring transient within a 33.3 millisecond interval. When the preliminary voltage threshhold is exceeded by the transient, the polarities of the transient voltage and of the transient current are ascertained and a tentative directivity determination is registered in an input latch.

When the transient voltage exceeds the nominal threshhold, the tentative directivity determination is entered into an output latch to be read by the output printing device and then cleared. If a larger transient pulse appears before the first transient's directivity is recorded for printing, the directivity information for this larger pulse will be substituted for the data previously stored in the output latch.

It is a still further aspect of the operation of the illustrative embodiment that when the transient disturbance reaches its peak value, hereinafter sometimes referred to as $V_p$, a dynamic feedback arrangement increases the effective value of the validating threshhold from its externally or user-set magnitude hereinafter sometimes referred to as $V_2$ to a new level $V_2'$ equal to that of the peak value $V_p$ achieved by the transient disturbance the observance of which had priorly been initiated. In addition, the apparatus of the illustrative embodiment scales-up the value of the preliminary threshhold $V_1$ to a new value $V_1'$. The scaled-up preliminary threshhold $V_1'$ guards against the detection of a subsequent impulse of lower magnitude occurring during the monitoring interval.

It is a further aspect of an illustrative embodiment as described in the copending application of P. Cox and E. R. Fix Ser. No. 879,233 filed of even data herewith that a more complete and meaningful record of an impulse type power line disturbance be made by measuring and recording the volt-second area of the disturbance, i.e., the integral of voltage with respect to time, in addition to the aforementioned data. The operation of an integrator to perform this measurement may conveniently be controlled by the previously discussed preliminary and validating threshholds. For example, the rise of the impulse through the preliminary threshhold ($V_1$) starts integration and, upon the impulse exceeding the validating threshhold ($V_2$) level, circuitry is enabled for the subsequent transfer of integral information to output latches. When the magnitude of the transient voltage disturbance later decreases from its peak value $V_p$ to the level of $V_1'$, the integrating circuitry is turned off. Thus, the integrator is turned off "earlier" at $V_1'$ rather than later at $V_1$. This earlier turn-off avoids the effects that a "ringing" transient voltage would have since the trailing portion of a ringing transient which often accompanies a large magnitude voltage transient might otherwise keep the integrator in an ON state after the main peak of the transient had passed. For many purposes, it is the energy content or volt-second area of only the main peak disturbance that is of interest.

DESCRIPTION OF THE DRAWING

The foregoing and other objects and features of the present invention will become more apparent from the ensuing detailed description and drawing in which:

FIG. 5 shows the relationship among the preliminary, nominal or validating and enhanced preliminary and validating threshholds $V_1$, $V_2$, $V_1'$ and $V_2'$, respectively, in terms of the peak value $V_p$ of a transient voltage disturbance;

FIG. 6 shows waveforms occurring at certain indicated points in FIG. 4; and

FIG. 7 shows how FIGS. 1-4 are to be arranged.

BRIEF OVERVIEW

Because, as mentioned above, the polarity of the current transients on a capacitively loaded power line may reverse after the first slope polarity reversal of the impulse voltage waveform, the apparatus of the illustrative embodiment permits the polarity indications accompanying the transient disturbance to be recorded only if the voltage transient is still rising towards its peak value as it passes through the user-set, nominal validating threshhold $V_2$. To assure this, a preliminary threshhold $V_1$, which is lower than $V_2$, illustratively one-half the value of $V_2$, is automatically established when $V_2$ is set by the user.

Figure 1:
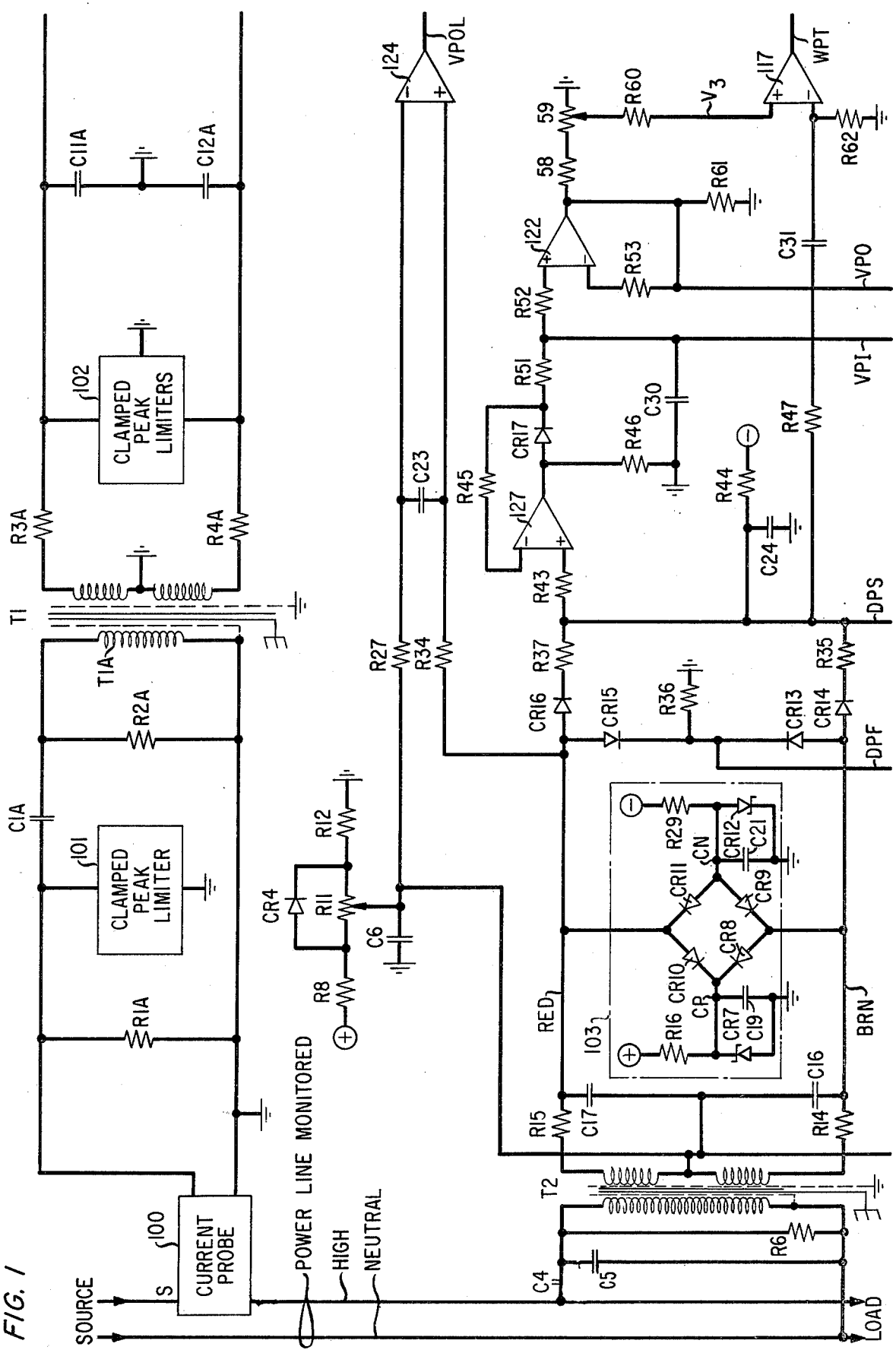
FIG. 1 shows the current and voltage sensing portions of the illustrative embodiment.

If, during the illustrative monitoring interval (two cycles of power line frequency), a transient disturbance occurs, the transient current and voltage polarities are ascertained by circuits shown respectively in the upper and lower portions of FIG. 1. When exclusive-OR gate U14A (FIG. 2, center) compares the polarities of the current transient appearing on lead IPOL and the voltage transient appearing on lead VPOL and applies the results of the polarity correlation to the D input of DIR flip-flop 205, the polarity of the voltage transient is also applied to the D input of VP flip-flop 206. Flip-flops 205 and 206 are part of an input latch comprising flip-flops 203 through 206. Information is clocked into the input latch however, only when the amplitude of the voltage transient is rising through the preliminary threshhold $V_1$. If the voltage transient then continues to rise and is still rising at threshhold $V_2$, the output latches, including DIRR flip-flop 211 and VPP flip-flop 212, are clocked and information stored in the input latch is transferred to the output latch.

The clocking of the input latch is under the control of "Pulse Present" lead PP at the output of comparator 325 (FIG. 3), and the clocking of the output latch is under the control of "Measurement Valid" lead MV at the output of comparator 326. Comparator 325 senses, at its lower input, the voltage $V_1$ which is the predetermined fraction of the user-set threshhold $V_2$. At its upper input, comparator 325 senses the transient voltage appearing on lead DPF. Comparator 326 senses, at its lower input, the nominal, user-set threshhold $V_2$ and, at its upper input, the voltage on lead DPS. Accordingly, if the transient voltage is still rising when it achieves the level of the nominal, user-set threshhold $V_2$, the directivity indications stored in the input latch are "validated" by being clocked into the output latch which, in turn, controls the pattern of illumination of display lamps D83 and D85.

The peak voltage $V_p$ actually attained during a two-cycle monitoring interval by a transient which exceeds the level of $V_2$ is stored in capacitor C30 (FIG. 1) and this level is maintained by operational amplifier 122. At the end of the monitoring interval, the voltage on C30 is reestablished over lead VPI at the nominal, user-set threshhold $V_2$. Before the end of the monitoring interval, however, the voltage on capacitor C30 delivered to lead VPO is effective to enhance the nominal threshhold value $V_2$, increasing it to the higher value $V_2' = V_p$. Likewise, the voltage on lead VPO is effective to enhance the preliminary threshhold value $V_2'$ to a higher value $V^{1'}$ which is a predetermined fraction of $V_p$.

If a subsequent transient occurs before the end of the monitoring interval, but after C30 has been charged by a prior transient to the value $V_p$, the input latch including DIR flip-flop 205 and VP flip-flop 206 will again be clocked, but only if the new transient is rising when it exceeds the enhanced threshhold value $V^{1'}$. If this occurs, the polarity indications determined for the new transient will replace, in flip-flops 205 and 206, the earlier indications stored therein. If this new transient continues to rise and is still rising when it reaches the level of the enhanced validating threshhold $V^{2'}$, the indications stored in the input latch will be transferred to the output latch. In this manner, only accurate directivity indications concerning the most significant transient occurring in the monitoring interval ultimately control the output directivity display.

GENERAL DESCRIPTION

Referring to FIG. 1, there is shown the circuitry associated with the current and voltage inputs. The current input circuit shown at the upper portion of FIG. 1 includes an input transformer T1 and clamped peak limiters 101 and 102. The current probe is a clamp-on device which may be installed without disconnection of the power line to be monitored. This connection effectively places resistor R1A "in series" with the power line on which transients are to be monitored. The current probe scales its output down by a large factor to a level convenient to be applied to resistor R1A. Accordingly, a transient voltage will be applied to the primary winding TIA of transformer T1 which is proportional to the magnitude of any current transient appearing on the power line in question. the magnitude of this transient voltage is limited to avoid injuring the electronic apparatus of the illustrative embodiment by a clamped peak limiter 101 connected between ground and capacitor C1A at the upper end of the primary winding of transformer T1 and clamped peak limiters 102 connected from resistors R3A and R4A to ground. Peak limiter 101 may comprise any well known diode limiting arrangement and may simply comprise a pair of serially connected diodes (not shown) returned to opposite-polarity clamping voltages and connected at their common junction point to the aforementioned capacitor C1A at the upper end of the primary winding of transformer T1. Advantageously, the diodes in limiter 101 may be designed for higher current carrying capacity than the diodes included on limiters 102.

Limiters 102 may advantageously be of the same form as clamped peak limiter 103 shown in detail at the secondary of voltage transient input transformer T2. In addition, where limiter 102 is of the same form as limiter 103, the serially connected diodes (not shown) of peak limiter 101 may advantageously be returned to the clamped, opposite voltage points of peak limiter 102 comparable to the clamped, opposite voltage points, CP, CN shown at the junction of each Zener diode and its respective current supply resistor in limiter 103. C1A, R2A and T1A comprise a high pass filter circuit which rejects line power frequencies, typically 50 or 60 Hz, while passing the frequency range of the impulse type disturbances to be analyzed. R3A, R4A, C11A, and C12A comprise a low pass filter which rejects impulse frequencies too high, typically above 1 MHz, for the circuits of the illustrative embodiment to accurately process.

Figure 2:
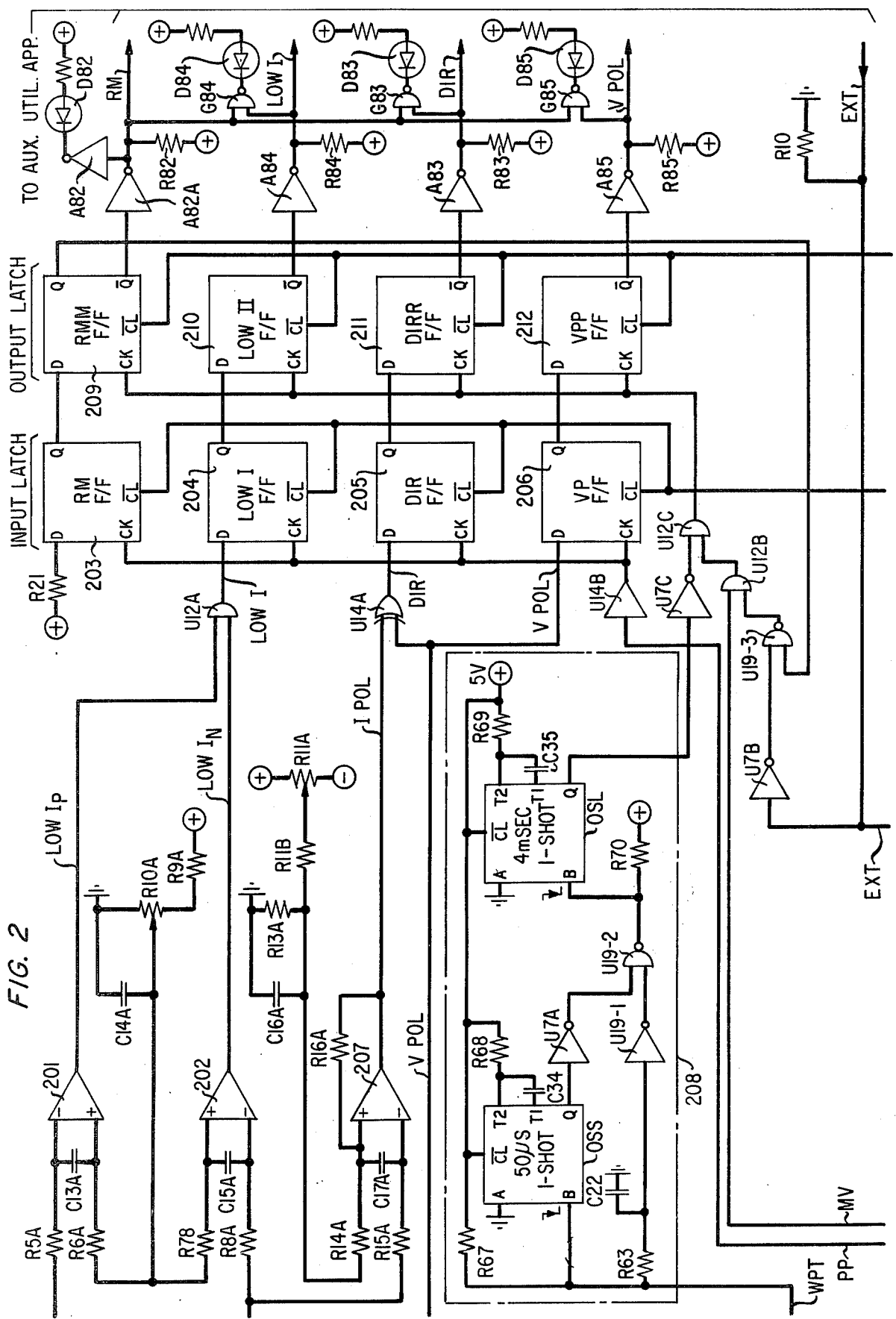
FIG. 2 shows the temporary storage and validated output latches and a wide pulse error rejection circuit.

The clamped, limited output voltages developed across the secondary windings of current input transformer T1 are applied to the upper input of comparator 201, FIG. 2, and to the lower input of comparator 202. The other inputs of comparators 201 and 202 are each connected to the slider of low limit adjusting potentiometer R10A. If either polarity of the current transient sensed by the transformer T1 is lower in absolute magnitude than the voltage to which potentiometer R10A is adjusted, lead $LOWI_P$ or lead $LOWI_N$, respectively, will be placed in the "1" state by the output of comparators 201 or 202, respectively. A "1" signal on both of these leads will cause AND gate U12 to apply a "1" signal to the D input of low current indicating flip-flop 204.

Flip-flop 204 is one of a bank of four D-type flip-flops 203 through 206 comprising an input latch. A D-type flip-flop is a flip-flop which will transfer the signal state presented at its D input to its Q output when the flip-flop is clocked by the application of an appropriate signal to its CK input. The setting of low current indicating flip-flop 204 indicates that the magnitude of the current transient lies within the band of ±n amperes. Such an indication may be employed by a power line disturbance analyzer having a paper tape printer (not shown but assumed to be connected at the right-hand side of FIGS. 2 and 4). Such an output indicating device may advantageously be the Series 606 "Power-Line Disturbance Analyser" manufactured by Dranetz Engineering Laboratories, Inc.

The voltage developed across the secondary winding of current input probe transformer T1 is also applied to the lower input of current polarity comparator 207. Capacitor C17A is connected across the inputs of comparator 207 (and capacitors C13A and C15A are connected across the inputs of comparators 201 and 202, respectively) to limit the response of the comparator to transients having at least a minimum time duration. In the illustrative embodiment, for example, it is desired to ignore pulses having a time duration less than approximately one-half microsecond. The upper input of comparator 207 is connected to the slider of current polarity offset potentiometer R11A. The output of comparator 207 is connected to the upper input of exclusive-OR gate U14A, the lower input of which, as will hereinafter be more fully explained, is connected to receive an input determined by the polarity of the voltage transient. Exclusive-OR gate U14A correlates the transient polarities applying a high signal to the D input of transient direction indicating flip-flop 205 is either, but not both of leads IPOL or VPOL exhibits the "1" signal state.

Returning now to FIG 1, there is shown at the lower left-hand portion thereof the circuitry associated with the voltage transient input. The primary winding of transformer T2 is connected across the power line through a capacitive voltage divider formed by C4 and C5 to receive any input voltage transient appearing thereon. C5, R6 and T2 comprise a high pass filter circuit which rejects line power frequencies, typically 50 or 60 Hz, while passing the frequency range of the impulse type disturbances to be analyzed. R15, R14, C16 and C17 comprise a low pass filter which rejects impulse frequencies too high, typically above 1 MHz, for the circuits of this embodiment of the invention to accurately process.

The voltage developed across the secondary of transformer T2 is applied to clamped peak limiter 103. When the transient appearing at the secondary winding of transformer T2 is in the positive direction, diode CR10 is forward-biased and clamps the upper-most lead "RED" to the voltage determined by Zener diode CR7. When the upper-most lead "RED" responds to a negative voltage transient, diode CR11 conducts and clamps lead RED to the negative voltage determined by Zener diode CR12. Similarly, diode CR8 conducts when lead BRN experiences a positive transient and diode CR9 conducts when lead BRN experiences a negative transient.

The polarity of the voltage transient appearing on lead RED is sensed by comparator 124 whose + and − inputs are connected, via resistors R34 and R27, to lead RED and the center tap of the secondary of transformer T2. Lead VPOL at the output of comparator 124 is continued into FIG. 2 where it is connected to the lower input of exclusive OR gate U14A and to the D input of voltage polarity indicating flip-flop 206.

Positive voltage transients appearing on leads RED and BRN, respectively, in FIG. 1, are applied through diodes CR15 and CR13, respectively, to lead DPF at the left end of resistor R36 developing thereacross a potential difference at the moment of transient occurrence. Lead DPF is continued into FIG. 3 where it is connected via resistor R31 to the upper input of pulse presence detecting comparator 325 and into FIG. 4 where it is connected to volt-second integrating circuitry 401.

Figure 3:
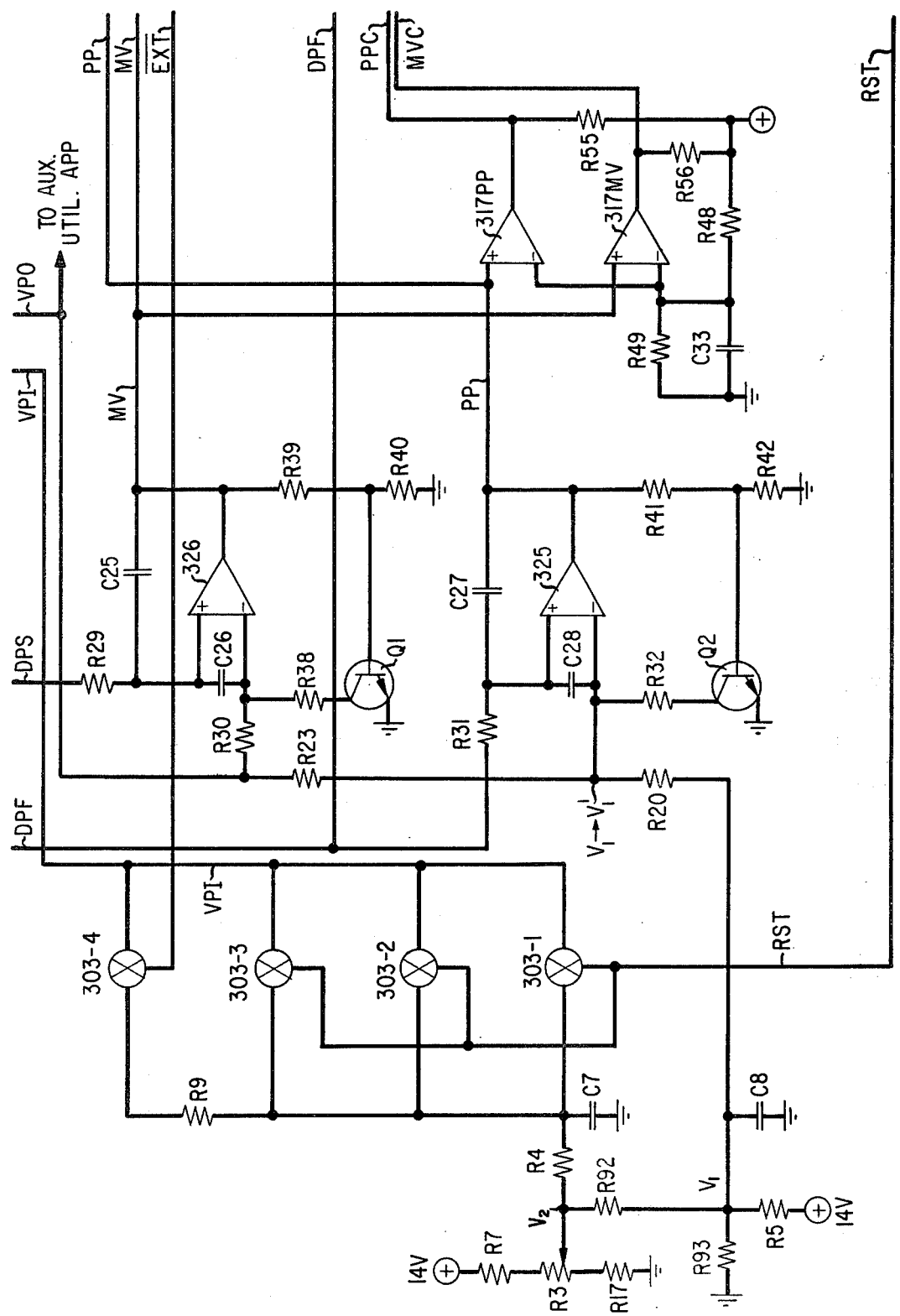
FIG. 3 shows the nominal and preliminary threshhold establishing circuitry.

In FIG. 3, comparator 325 senses, at its upper input terminal, the presence of a transient impulse on lead DPF and, at its lower input terminal, a threshold voltage $V_1$ determined in part by the setting of external threshold setting control R3 and in part by the fixed voltage divider comprising R92 and R93. Advantageously, the fixed divider R92–R93 delivers to the lower input terminal of comparator 325 a voltage which is approximately one-half the voltage developed at the slider of threshhold setting control R3. Resistor R5 feeds a small, relatively constant current to the junction of R92 and R93. This current causes $V_1$ to become a higher percentage of $V_2$ as lower values of $V_2$ are selected. This is necessary to correct for peak detector lower level non-linearity which will subsequently be discussed. When the transient voltage appearing on lead DPF exceeds the threshhold voltage $V_1$, comparator 325 applies a "1" signal to lead PP. (See time $t_1$ in FIG. 5 and line A of FIG. 6).

Returning to FIG. 1, positive voltage transients appearing on leads RED and BRN, respectively, are applied through diode CR16 and resistor R37, and through diode CR14 and resistor R35, respectively, to lead DPS and capacitor C24 at its junction with resistor R44. The signal developed on lead DPS is forwarded via resistor R43 to the lower input of operational amplifier 127 which commences to charge capacitor C30 to the peak value of the signal through diode CR17 and resistor R51. The peak value of the voltage on capacitor C30 is applied via buffer amplifier 122 to lead VPO.

The signal developed on lead DPS is also continued in FIG. 1 via resistor R47 and capacitor C31 to the lower input of comparator 117 and, in FIG. 3, via resistor R29 to the upper input of measurement validating comparator 326. The lower input of comparator 326 is connected via resistor R30 to lead VPO. Resistors R23 and R20 are a voltage divider which adds a portion of the VPO level to $V_1$ and applies the resultant voltage to the lower input of comparator 325. The purpose of resistors R23 and R20 will be herinafter more fully explained.

Comparator 325 initially senses the difference between the preliminary voltage threshhold $V_1$ and the magnitude of the incident voltage transient appearing on lead DPF. Comparator 326 initially senses the difference in potential between the signals appearing upon leads VPO and DPS.

The apparatus detailed in FIGS. 1 through 4 is advantageously to be used with an auxiliary utilization and indicating apparatus which advantageously may take the form of the aforementioned model 606 Power Line Disturbance Analyzer. In addition, output leads RM, DIR, LOWI, and VPOL in FIG. 2 may be connected via conventional driver circuitry (not shown) to each operate a simple neon bulb display lamp or, as hereinafter described, a respective one of light-emitting diodes D82 through D85.

Figure 4:
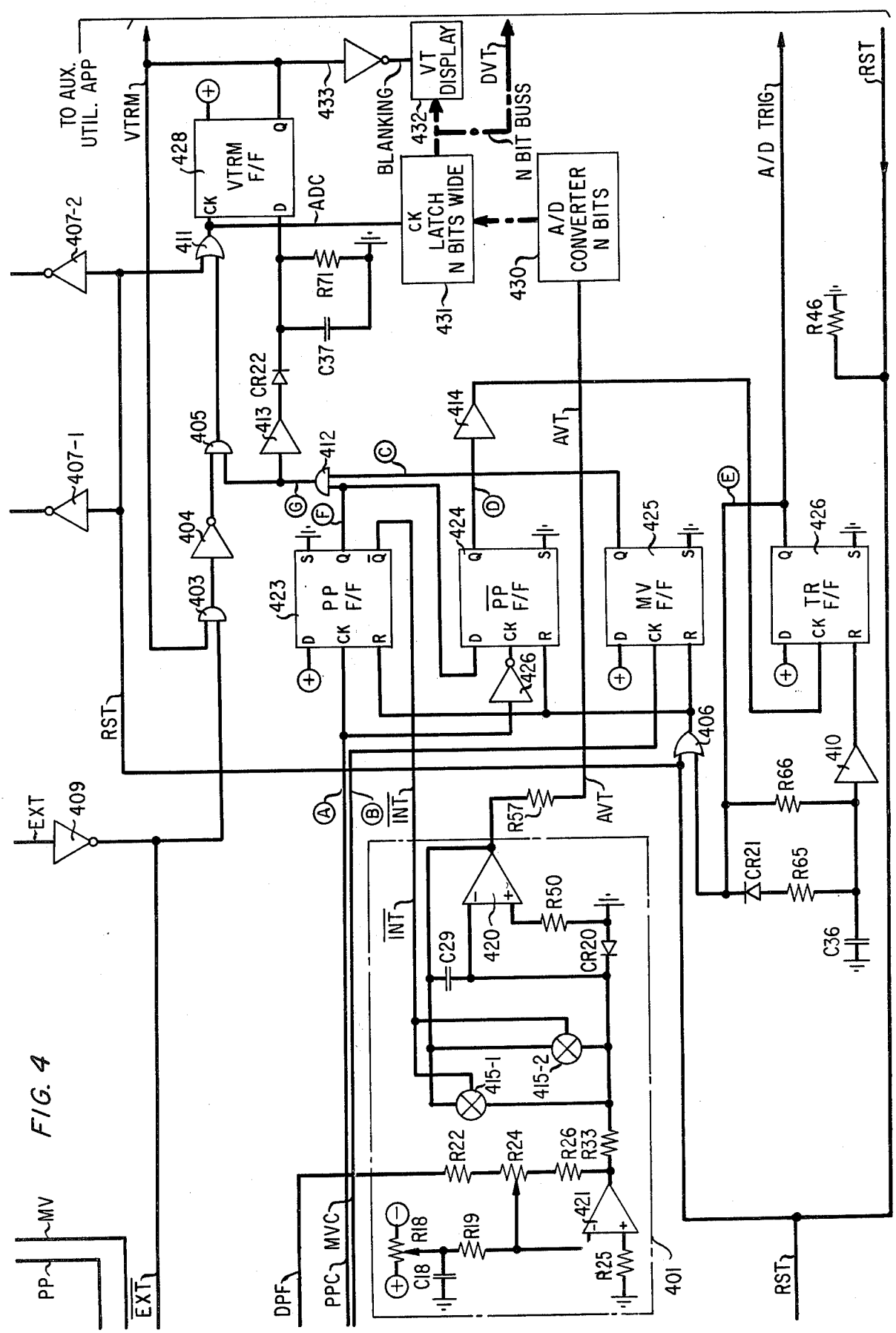
FIG. 4 shows the volt-second integrator and the circuitry for controlling the delivery of data to an auxiliary output indicating apparatus that may be used with the invention.

The auxiliary utilization apparatus is required to provide merely two inputs, a continuous battery potential to lead EXT in the lower right-hand corner of FIG. 2 and a periodic reset signal to lead RST in the lower right-hand corner of FIG. 4. The function of the battery potential on lead EXT will be hereinafter described. Illustratively, the reset signal may be applied as a positive 2 microsecond pulse once every 32 milliseconds. The reset signal on lead RST is applied through inverters 407-1 and 407-2 to FIG. 2 to clear input latches 203 to 206 and output latches 209 through 212. The reset signal on lead RST is also applied through OR gates 406 to reset flip-flops 423 to 425.

The reset signal on lead RST is continued to the control terminal of IC gate 301-1 through 303-3, FIG. 3. The reset signal periodically enables these gates to apply the validation threshhold voltage $V_2$ to lead VPI thereby recharging capacitor C30, FIG. 1, to this level. the + input of buffer amplifier 122 in FIG. 1 is connected via resistor R52 to lead VPI to sense the potential to which capacitor C30 is charged and amplifier 122 at its output applies this voltage to lead VPO. Accordingly, prior to the arrival of any transient signal, the $V_2$ validation threshhold voltage that amplifier 122 applies to lead VPO is sensed at the lower input of comparator 326 in FIG. 3.

When (at time $t_1$ illustrated in FIG. 5) a voltage transient appears on lead DPF which exceeds the preliminary threshhold $V_1$ applied to the lower input of comparator 325, comparator 325 applies a "1" signal to lead PP. Driver amplifier 317PP applies a "1" signal to lead PPC which is continued into FIG. 4 to clock flip-flop 423. The "1" signal on lead PP is also continued into FIG. 2 and is applied through driver U14B to clock the input latch flip-flops 203 through 206.

After a delay interval determined by the RC time constant of either resistor R37 or R35 and the capacitance of capacitor C24, the transient signal appears on lead DPS. This transient signal is applied through resistor R47 and is A.C. coupled by capacitor C31 and resistor R62 and applied to the lower (−) input of operational amplifier 117.

If the transient magnitude appearing on lead DPS exceeds the voltage level appearing on lead VPO, comparator 326 (FIG. 3) places a "1" signal on lead MV. (See time $t_2$ in FIG. 5 and line B in FIG. 6.) The "1" signal on lead MV is continued to FIG. 2 where it is applied to the upper input of AND gate U12B. Assuming that the outputs of latches 203 to 206 and 209 to 212 have previously been cleared, NAND gate U19-3 will apply a high signal to the lower input of AND gate U12B allowing gate U12B to connect the "1" signal on lead MV to the lower input of AND gate U12C. If gate U12C is not blocked by a low signal from inverter U7C which is under the control of wide pulse error rejection circuit 208, the "1" signal on lead MV will clock output latches 209 to 212. The function of wide pulse error rejection circuit 208 will be described presently. Accordingly, it is seen that the states to which the flip-flops 203 to 206 of the input latch have each been set incident to the appearance of a "1" signal on lead PP are transferred to the corresponding flip-flops 209 to 212 of the output latch when a "1" signal appears on lead MV. The flip-flops 209 through 212 of the output latch energize leads RM, DIR, LOWI, and VPOL to the auxiliary utilization apparatus not shown and advantageously also to neon display bulbs (not shown).

At the same time that the aforementioned transient impulse first appears on lead DPF, FIG. 1, is it also applied by lead DPF through FIG. 3 to integrating circuit 401, FIG. 4. The signal on lead DPF is applied via resistor R22 and a portion of potentiometer R24 to the inverting input of amplifier 421. Potentiometer R18 in series with resistor R19 sets the offset voltage of this amplifier while the setting of potentiometer R24 adjusts the gain to the desired value. When comparator 325 (FIG. 3) applies a "1" signal to lead PP, driver 317PP continues the "1" signal to lead PPC in FIG. 4. The "1" signal on lead PPC is applied to the CK (clock) input of flip-flop 423 causing its Q output connected to lead F to go high and its $\overline{Q}$ output connected to lead $\overline{INT}$ to go low. When lead $\overline{INT}$ goes low, gates 415-1 and 415-2 which shunt capacitor C29 are open-circuited allowing capacitor C29 to the charged by the output of amplifier 420. Amplifier 421, responding to the input transient, drives inverting operational amplifier 420 which charges capacitor C29 in a manner that represents the time varying integration of the input transient. The output of amplifier 420 is coupled through resistor R57 to lead AVT which undergoes a rise in potential proportional to the integral of the voltage transient. The potential rise on lead AVT is, in other words, proportional to the volt-seconds area of the voltage transient curve. For digital output purposes, the analog voltage on lead AVT may be connected through analog-to-digital converter 430 and latches 431 to appear on digitally coded output bus DVT. Also, the information on bus DVT may be applied to a compatible digital display device 432. The display device may be blanked prior to the first valid transient by coupling the output of VTRM F/F 428 through inverter 433 to the blanking input of said display. Latch 431 operates as follows: when line ADC connected to its clock input is high the output data of the latch follows the input data, i.e., output=input. When line ADC subsequently goes to its low state, no further change in the latched output data takes place. A/D converter 430 may advantageously be of the "all-parallel" type. The conversion process is continuous in this type of converter so its digital output always reflects its analog input without initiation of any conversion process or sequence.

Timing of the impulse area integration process is accomplished by flip-flops 423 through 426 (FIG. 4) as follows. Waveforms at the various points labelled by encircled letters A through G in FIG. 4 are shown by FIG. 6. Time markers $t_1$ through $t_5$ correspond to similarly designated points in FIG. 5.

The integration of the voltage transient to compute its "volt-seconds" area by line PPC (FIG. 4) going high. This clocks F/F 423 causing its Q output to go high and its $\overline{Q}$ output to go low as previously discussed. The $\overline{Q}$ output, line $\overline{INT}$, being low allows the integration process to begin. The Q output (high) of F/F 423 is applied to the D input of F/F 424 and to the left input of AND gate 412. If the amplitude of the transient voltage pulse being integrated is greater than the validation threshhold, line MVC goes high as previously discussed and clocks F/F 425 causing its Q output to go to the high state. The Q output of F/F 425 is applied to the right input of AND gate 412. The output of gate 412 goes high since both its inputs are high and is applied to the input of driver 413 and the lower input of AND gate 405. The upper input of gate 405 is also high since line $\overline{EXT}$ is assumed to be low. Gate 405 therefore transfers the high state to its output and applies it through OR gate 411 to the clock inputs of VTRM F/F 428 and latches 431. These devices are D-type flip-flops of the level triggered variety. In such devices the Q (data) outputs follow the state of the D inputs while the clock signal is high and do not change after the clock signal returns to its low state.

When the amplitude of the transient voltage pulse being integrated falls through threshhold level $V_1'$ line PPC goes low since as hereinafter discussed, comparator 325 compares the voltage transient with the threshold voltage $V_1'$ appearing on lead VPO. Line PPC is applied to the clock input of F/F 424 through inverter 426 causing the Q output of the flip-flop to go high since its D input has previously been set high by F/F 423. The Q output of F/F 424 is applied through driver 414 to the clock input of F/F 426. Driver 414 merely provides a slight propagation delay. A high state on the clock input of F/F 426 causes its Q output to go high. This output is applied to the reset inputs of flip-flops 423 through 425 causing all their Q outputs to go low and $\overline{Q}$ outputs to go high. The $\overline{Q}$ output of F/F 423 places line $\overline{INT}$ in a high state ending the integration interval and discharging capacitor C29. Both inputs of gate 412 go low causing its output to go low which, transferred through gates 405 and 411, causes the clock input of F/F 428 to go low latching its output in the high state. The low output state of OR gate 411, applied to the clock input of latch 431 causes this latch to store its data last received from converter 430 but not to respond to any further input changes. Also, the Q output of F/F 426 is connected to its own reset input through a delay network comprised of R66 and C36 and buffer 410. Therefore, after a predetermined delay, illustratively 20 microseconds, F/F 246 resets itself as well to complete the pulse integration process.

With reference to FIG. 5, it is shown therein that, at an arbitrary time $t_0$, an illustrative, hypothetical transient is assumed to begin to exhibit a nonzero value. At some later arbitrary time designated $t_1$, the monitoring interval begins as the amplitude of the illustrative transient is shown having a value equaling that of the designated "initial" preliminary threshold $V_1$. At this same time, likewise designated $t_1$ in FIG. 6, the "Pulse Present" line A depicts the signal level at the point circled "A" in FIG. 4 corresponding to the signal level on the "Pulse Present-PP" lead at the output of comparator 325, FIG. 3. At the arbitrarily later time $t_2$ within the monitoring interval, the illustrative transient has an amplitude equaling that of the designated initial user-set threshold $V_2$. At this same time, likewise designated $t_2$ in FIG. 6, the "Meas. Valid" line B depicts the signal level at the point circled "B" in FIG. 4 corresponding to the signal level on the "measurement valid"-MV lead at the output of comparator 326, FIG. 3. Line C depicts the signal level at the output of MV flip-flop which output is immune to any undulations that may be present in the signal level on line B.

At an arbitrarily later time designated $t_3$ within the monitoring interval, the illustrative transient exhibits its peak value $V_p$. Operational amplifier 127 continues charging capacitor C30 until that peak value appears at the slightly later time designated $t_4$.

It has thus far been assumed that a transient has occurred after the initial charging of capacitor C30 of FIG. 1 to the validation voltage level $V_2$. After the arrival of this first transient, capacitor C30 will have been charged by time $T_4$ in FIG. 5 to the peak value thereof. Let it now be assumed that another transient arrives before the next reset pulse is applied to lead RST. Capacitor C30 will have been charged to the peak value of the preceding transient and buffer amplifier 122 will be applying this voltage $V_p$ to lead VPO when the second transient arrives. Upon the arrival of the second transient, lead DPF will be energized and comparator 325 (FIG. 3) will have this transient applied to its upper terminal. The lower terminal of comparator 325 will now, however, be sensing a fraction of the voltage $V_p$ rather than merely the preliminary threshold voltage $V_1$ since a fraction of the potential on lead VPO is applied to the lower terminal of comparator 325 by resistor R23, the fraction thereof being determined predominantly by the relative resistance of R23 to R20 in series with the parallel combination of R92 and R93. Accordingly, comparator 325 will not apply a "1" signal to lead PP unless the magnitude of this subsequent transient exceeds the enhanced preliminary threshhold level, $V_1'$, now established at the lower input of comparator 325. Likewise, comparator 326 which senses the difference in the potential between leads DPS and VPO will not apply a "1" signal to lead MV unless the potential on lead DPS occasioned by the arrival of the second transient exceeds the voltage $V_p$ on lead VPO (i.e., the second transient is greater than the first).

Accordingly, if a second transient exceeds the enhanced preliminary threshhold level $V_1'$, information concerning this transient will be clocked into the input latch, F/F 203 through 206. Additionally, if the second transient exceeds the peak value $V_p$ of the first transient, the new data will also be clocked into the output latch, F/F 209 through 212. If, however, the second transient rises above the level $V_1'$ which will cause comparator 325 to respond but does not exceed the voltage $V_p$, comparator 326 will still not apply a "1" signal to lead MV. Thus, the information that may have been clocked into the input latch will not be transferred to the output latch. The relationship among preliminary threshhold voltage $V_1$, validation threshhold voltage $V_2$, the peak value of the transient $V_p$ and the enhanced preliminary threshhold $V_1'$ are shown in FIG. 5.

If still another transient occurs which exceeds the peak value $V_p$ of the first transient (or of any preceding transient since the last reset pulse on lead RST), comparator 325 will apply a "1" signal to lead PP and comparator 326 will apply a "1" signal to lead MV allowing the new current and voltage polarities to be entered into the input latch and transferred to the output latch circuitry of FIG. 2. In this case, the new values entered into the latches simply override the old values.

It has been stated before that the effects of a wide pulse having a time duration that exceeded the low pass band width limitations necessary to reject the basic mains frequency would also have to be rejected to prevent erroneous response. Circuit 208, FIG. 2, provides for this protection against wide transient pulse error. Comparator 117, FIG. 1, receives at its upper (+) input terminal a voltage $V_3$ which is a fraction of the voltage present on lead VPO. At its lower (−) input, comparator 117 receives the input transient on lead DPS a.c. coupled through capacitor C31. Comparator 117, accordingly, applies a negative-going signal to lead WPT whenever a transient signal appears on lead DPS exceeding threshhold voltage $V_3$. The magnitude of the transient to which comparator 117 responds is determined by the setting of variable resistor R59 which scales the value of the voltage appearing on lead VPO.

The signal applied to lead WPT is continued in FIG. 2 to the B input of one-shot circuit OSS and via resistor R63 inverter U19-1. The input to U19-1 is delayed slightly by resistor R63 and capacitor C22. This delay is required to prevent triggering of circuit OSL by the initial negative-going transient on line WPT as follows: When the negative-going WPT line triggers circuit OSS the Q output will go high causing the output of U7A to go low. If, however, the negative-going WPT line caused the output of U19-1 to go high before the output of U7A goes low, the output of U19-2 would momentarily go low triggering circuit OSL prematurely.

The B inputs of circuits OSS and OSL are normally maintained in the high signal state by resistors R67 and R70, respectively. Circuit OSS is controlled as to the duration of its mono-stable state by the selection of capacitor C34 and resistor R68. Circuit OSS is triggered by the low signal on lead WPT and, when triggered, maintains its Q output in the high signal state for a predetermined interval, illustratively, 50 microseconds.

When the transient signal sensed by comparator 117 terminates, it applies a high signal to lead WPT. This high signal has no effect with the B input of circuit OSS. The high signal on lead WPT is changed by inverter U19-1 to a low signal at the input of NAND gate U19-2, but this signal does not affect the pre-existing high signal at the output of gate U19-2. Circuit OSL therefore remains in its nontriggered state. The low signal condition of the Q output of circuit OSL is reflected by inverter U7C as a high signal applied to the upper input of AND gate U12C. Gate U12C is thus in condition to pass clock signals to the output latch flip-flops 209 through 212 when such signals are developed by the remainder of the circuitry of FIG. 2, heretofore described.

Upon the termination of the predetermined interval, the Q output of circuit OSS goes low and inverter U7A applies a high signal to the upper input of NAND gate U19-2. If, at this time, the transient signal is still being detected by comparator 117, lead WPT will still be in the low signal state and inverter U19-1 will still be applying a high signal to the lower input of NAND gate U19-2. NAND gate U19-2 will thus have high signals applied to both of its inputs and will, in turn, apply a low signal at the B input of one-shot circuit OSS, triggering circuit OSL to apply a high signal state at its Q output. The interval of circuit OSL's mono-stable operation is determined by the values of resistors R69 and capacitor C35 and, in the illustrative embodiment, is advantageously 4 milliseconds, or somewhat longer than the duration of disturbances typically caused by pulses wider than may be passed without significant distortion by the input filter circuits used in this embodiment of the invention.

During the interval of circuit OSL's mono-stable operation, output latches 209 through 212 are blocked at gate U12C from receiving any clock signals and so cannot deliver any data that will have been stored in input latches 203 to 206 to the auxiliary utilization apparatus (not shown).

It was mentioned above that the auxiliary utilization apparatus (not shown), in addition to providing the reset signal on lead RST, also provides battery on lead EXT. The battery (high signal) on lead EXT is reflected by inverter 409 in FIG. 4 as a low signal to block AND gate 403. The blocking of gate 403 prevents the Q output of VTRM flip-flop 428 from locking itself up after the flip-flop is clocked the first time.

If it is not desired to have flip-flop 428 in condition to accept a subsequent clock pulse through gate 412, battery (not shown) may be removed from lead EXT. When battery is removed from lead EXT, flip-flop 428 and latch 431 after having been set, will accept no subsequent data until after a reset signal (high on lead RST) has been applied.

Similarly, a high signal on lead EXT through inverter U7B places a low signal on the upper input of NAND gate U19-3 blocking the $\overline{Q}$ output of F/F 209 from inhibiting the passage of additional clock signals through AND gate U12B.

If it is not desired to have flip-flops 209 through 212 in condition to accept subsequent clock pulses through gate U12B, battery (not shown) may be removed from lead EXT. When battery is removed from lead EXT, flip-flops 209 through 212, after having been set, will accept no subsequent data until after a reset signal (high on lead RST) has been applied.

This feature allows for operation of the invention in a single measurement mode where data on the first pulse after reset is stored for an indefinite period until the reset signal is next applied.

An additional feature of this embodiment of the invention is to make provision for the convenient use of an external digital voltmeter (not shown) to read and display the peak voltage of the impulse being analyzed. Lead VPO, upper right corner of FIG. 3, may be connected to the signal input of said external digital voltmeter while the voltmeter may be triggered by the pulse provided on lead A/D TRIG, lower right side of FIG. 4.

While, as previously described, the illustrative embodiment is preferably to be used with an auxiliary recording apparatus of the type previously referred to there are shown at the right-hand portion of FIG. 2, an array of light emitting diodes D82, D84, D83 and D85 associated with the Q outputs of the flip-flops 209 through 212 constituting the output latch for providing an output display appropriate to the observed transients. Diode D82 will be illuminated when the output latch is clocked to indicate that an appropriate reading of transient voltage and polarity has been made. Diode D84 will be illuminated in the event that a voltage transient has been detected that is accompanied by a current transient whose amplitude is insufficient to warrant recording. Diode D85 will be illuminated when the polarity of the transient voltage detected is positive. Diode D83 will be illuminated when the transient impulse propagates from "SOURCE" to "LOAD" (see FIG. 1). If Diode D82 is illuminated but diode D85 is not, the polarity of the transient voltage detected is negative. If diode D82 is illuminated but diode D83 is not, the direction of propagation of the impulse detected is from "LOAD" to "SOURCE" (see FIG. 1).

What has been described are the salient characteristics of one illustrative embodiment of the invention. Obvious modifications may be made by those skilled in the art to the component circuits such as to extend or alter the range of frequency, voltages, currents, etc. of the power lines on which transients are to be observed.

Obviously, also, the current polarity lead IPOL may be provided with its own separate set of input and output latch flip-flops similar to voltage polarity flip-flops 206 and 212 and, in this case, the inputs to the transient polarity correlating gate (exclusive-OR gate U14A) may be shifted to the output of such current polarity latch flip-flop (not shown) and the output of the voltage polarity flip-flop. Further and other modifications may also be made without, however, departing from the spirit and scope of the invention.

What is claimed is:

1. In a circuit for indicating the direction of origin of a transient impulse appearing on a power line by correlating the polarities of the transient current and transient voltage caused by the impulse, the improvement comprising:
   threshhold determining means for establishing the nominal amplitude of a transient whose direction of origin is to be indicated,
   means for initiating the ascertainment of transient current and voltage polarities at a transient amplitude exceeding approximately half said nominal amplitude established by said threshhold determining means,
   means controlled by said ascertainment means for correlating said transient polarities to indicate a direction of transient origin, and
   means responsive subsequent to said initiating of said ascertainment to the said transient equaling at least said nominal amplitude for validating the indication of the said direction of origin thereof.

2. The invention according to claim 1 wherein said means for validating includes means responsive to the peak value attained by said transient for temporarily increasing the threshhold of said threshhold determining means.

3. The invention according to claim 1 wherein said means responsive subsequent to said initiating includes means for temporarily increasing the threshhold of said means for initiating said ascertainment.

4. In a circuit for indicating the direction of origin of a transient disturbance appearing on a power line, the combination comprising,
   means for ascertaining the polarities of current and voltage accompanying said transient disturbance,
   first threshhold detecting means responsive to a transient voltage signal having a predetermined magnitude for rendering operable said ascertaining means,
   correlating means controlled by said ascertaining means for provisionally storing an indication of said direction of origin,
   output display means, and
   second threshhold detecting means responsive to the occurrence of a transient voltage signal having a magnitude in excess of said first threshhold for connecting said provisionally storing means to said output display means.

5. In a circuit for indicating the direction of origin of a transient impulse appearing on an electrical power line by correlating the polarities of the transient current and transient voltage caused by the impulse, the invention comprising:
- means (205) for storing a preliminary directivity determination when a first voltage threshhold ($V_1$) is exceeded by said transient,
- means (211) for receiving said directivity determination when a second voltage threshhold ($V_2$) higher than said first threshhold is exceeded by said transient,
- means (RST, 407-1, 407-2, A83, DIR) for reading and resetting said receiving means and for resetting said storing means at periodic intervals, and
- means (C30, 122 R61, VPO, R30, R23) for increasing said first and second threshhold in accordance with the peak value of the largest transient occurring during one of said periodic intervals.

6. In a circuit for indicating the direction of origin of a transient impulse appearing on an electrical power line by correlating the polarities of the transient current and transient voltage caused by the impulse, the invention comprising:
- means (325) for comparing said transient impulse with a first voltage threshhold ($V_1$),
- means (205) controlled by said comparing means (325) for storing a preliminary directivity determination,
- means (326) for comparing said transient impulse with a second voltage threshhold ($V_2$) higher than said first threshhold ($V_1$),
- means (211) controlled by said comparing means (326) for receiving said directivity determination,
- means (C30, 122, R61, VPO, R30, R23) for increasing said first and second threshhold in accordance with the peak value of the largest transient impulse occurring within a predetermined interval.

7. A circuit for determining the direction of origin of a transient disturbance appearing on a power line during a predetermined interval, comprising:
- means for detecting and comparing the polarities of voltage and current transients on said power line to derive directivity indications pertaining to said disturbance;
- first storing means for storing during said interval and when said voltage transient is rising through a first threshhold the directivity indications derived by said means for detecting and comparing;
- second storing means for receiving from said first storing means said indications when said voltage transient is rising through a second voltage threshhold higher than said first threshhold; and
- means for displaying said indications stored during said interval in said second storing means.

8. In a circuit for indicating the direction of origin of a transient disturbance the combination comprising:
- means for preliminarily storing indications of the polarities of the transient current and voltage accompanying said disturbance while the magnitude of said disturbance is rising through a first threshhold; and
- means thereafter controlled while said magnitude of said disturbance is passing through a second threshhold higher than said first threshhold for displaying said stored indication.

9. In a circuit according to claim 8, the combination further comprising:
- means controlled in accordance with the peak magnitude attained by said transient for increasing during a predetermined interval said first and said second threshhold.

10. In a circuit according to claim 9, the combination further including means operational after the expiration of said predetermined interval to re-establish said second threshhold at a predetermined value.

11. In a circuit according to claim 9, the combination further comprising:
- fixed interval timing means for defining an interval shorter than the duration of a transient signal exceeding the low frequency response of said indicating circuit;
- means responsive to the initial appearance of a voltage transient exceeding a predetermined amplitude for starting said timing means; and
- means operative during the running of said timing means for maintaining said display means operative to display said stored indications and for terminating said display if said transient persists after the termination of said fixed interval.

* * * * *